United States Patent
Shafer

(10) Patent No.: US 7,660,570 B2
(45) Date of Patent: Feb. 9, 2010

(54) ACTIVE STEP ATTENUATOR

(75) Inventor: Steve Shafer, Chittenango, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 490 days.

(21) Appl. No.: 11/684,708

(22) Filed: Mar. 12, 2007

(65) Prior Publication Data

US 2008/0224798 A1    Sep. 18, 2008

(51) Int. Cl.
*H04B 1/10* (2006.01)

(52) U.S. Cl. .................. 455/299; 455/213; 455/286; 455/306; 725/126; 375/221; 370/486

(58) Field of Classification Search .............. 455/299, 455/213, 286, 306, 307, 249.1; 725/126, 725/118, 121, 127; 375/221; 370/486, 487
See application file for complete search history.

(56) References Cited

U.S. PATENT DOCUMENTS

| | | | |
|---|---|---|---|
| 3,598,902 A | | 8/1971 | Davis et al. |
| 4,466,017 A | | 8/1984 | Banker |
| 4,471,380 A | | 9/1984 | Mobley |
| 4,520,507 A | | 5/1985 | Moon |
| 5,263,021 A | * | 11/1993 | Ortel ..................... 370/487 |
| 5,321,849 A | | 6/1994 | Lemson |
| 5,678,198 A | | 10/1997 | Lemson |
| 5,737,687 A | | 4/1998 | Martin et al. |
| 5,956,075 A | | 9/1999 | Matsuo |
| 6,285,865 B1 | * | 9/2001 | Vorenkamp et al. ........ 455/307 |
| 6,549,766 B2 | * | 4/2003 | Vorenkamp et al. ........ 455/307 |
| 6,570,465 B2 | * | 5/2003 | Tang ..................... 333/109 |
| 6,598,232 B1 | * | 7/2003 | McAlear ................. 725/126 |
| 6,865,381 B2 | * | 3/2005 | Vorenkamp et al. ........ 455/307 |
| 7,194,037 B1 | * | 3/2007 | Sutardja ................. 375/258 |
| 7,486,722 B2 | * | 2/2009 | Brommer et al. .......... 375/222 |
| 7,515,895 B2 | * | 4/2009 | Vorenkamp et al. ........ 455/307 |
| 2001/0011013 A1 | * | 8/2001 | Vorenkamp et al. ........ 455/307 |
| 2002/0067222 A1 | * | 6/2002 | Tang ..................... 333/109 |
| 2003/0114112 A1 | | 6/2003 | Strater et al. |
| 2005/0054315 A1 | | 3/2005 | Bajgrowicz et al. |
| 2005/0250541 A1 | | 11/2005 | Bird et al. |
| 2006/0031911 A1 | | 2/2006 | Shafer et al. |
| 2008/0313694 A1 | * | 12/2008 | Kudo et al. .............. 725/131 |
| 2009/0052901 A1 | * | 2/2009 | Cagle ................... 398/116 |

OTHER PUBLICATIONS

*A Voltage Variable Attenuator Using Silicon PIN Diodes and a Passive GaAs MMIC in a Plastic SMT Package*; Microwave Journal; Nov. 2000; RF & MW Components Group, M/A-Com Inc., Lowell, MA www.mwjournal.com.
*A Low-Cost Surface Mount PIN Diode Attenuator*; Hewlett-Packaged RF and Microwave Applications Seminar; 1973 www.semiconductor.agilent.com.
*APNI003: A Wideband General Purpose PIN Diode Attenuator*; Skyworks Solutions, Inc.; Dec. 5, 2005 www.skyworksinc.com.

* cited by examiner

*Primary Examiner*—Minh D Dao
(74) *Attorney, Agent, or Firm*—Alston & Bird LLP

(57) ABSTRACT

An active step attenuator can attenuate the RF signal from a cable modem or other RF source. The active step attenuator converts the RF energy into a DC control signal that controls the attenuation applied to the RF signal. The voltage of the control signal is proportional to the RF energy, so that the active step attenuator attenuates a stronger RF signal more than a weaker RF signal. The active step attenuator may be in the form of a diplex circuit, one branch of which passes signals in one frequency band without attenuation and the other branch of which actively attenuates signals in another frequency band.

25 Claims, 6 Drawing Sheets

ACTIVE STEP ATTENUATOR

BACKGROUND OF THE INVENTION

The present disclosure relates to a method and apparatus for attenuating RF signals and to a bidirectional communications system incorporating such an apparatus. In one embodiment, the disclosed apparatus can be used to control return path attenuation in a bidirectional cable ("CATV") system.

Many communication systems include a head end and a plurality of subscriber units. A forward path carries signals from the head end to a subscriber unit and a reverse path carries signals from the subscriber to the head end. In a frequency division duplexed communication system, forward path and reverse path signals may be transmitted in separate and non-overlapping frequency bands.

One example of such a system is a bidirectional CATV system with a head end controlled by a system operator and with a plurality of subscribers' televisions equipped with set top boxes or cable modems. Signals on the forward path of the CATV system include broadcast television channels; signals on the reverse path include data related to video on demand, internet access, or other services provided by the system operator. In one possible configuration, the CATV system is hybrid fiber optic/coaxial with at least one node between the head end and the subscriber. In such a system, the signals are transmitted between the head end and the node via optical fiber, and between the node and the subscriber unit via coaxial cable.

Performance of communication systems such as a CATV system can be significantly improved by appropriate power control, including appropriate attenuation of signals. This attenuation can reduce ingress noise and equalize different signal levels from cable modems at different taps to improve the signal to noise ratio. Forward path power in a CATV system is controlled more easily than return path power because all forward path signals originate from one location. Loss in the return path may be more difficult to manage because of the great variance from tap to tap. For example, the distance from the subscriber to the node affects the attenuation the return path signals will experience in the coaxial cable. In another example, ingress noise can result from RF sources near open taps in or near the subscriber's location. Moreover, conditions may be time varying, as where an interfering RF source is intermittent or varies in power with time.

For maximum performance, return path power should be tailored to the specific properties of each subscriber. A prior art device that provides attenuation in a CATV system is a simple high-pass, low-pass, or band-pass filter. A filter can attenuate signals in one frequency band but pass signals in a different frequency band without attenuation. Such a filter is disadvantageous, however, because outside of a transition range it provides either very large attenuation or no attenuation at all to a signal at a particular frequency. Thus a filter either does not attenuate the return path or it inhibits all communications on the return path. Better performance will be achieved if attenuation levels can be selected precisely at each tap.

Another prior art device that provides attenuation in a CATV system is a passive step attenuator. A passive step attenuator can be designed to provide flat loss in a particular frequency band. Thus a system operator can in theory design a passive step attenuator with the appropriate attenuation for each subscriber.

Reliance on the passive step attenuator, however, has a number of disadvantages. First, the passive step attenuator must be manufactured and sold separately from the cable modem itself because the needed attenuation cannot be determined until the cable modem is installed at the subscriber's location.

Second, the producer must make multiple versions of the passive step attenuator, each providing a different level of attenuation for a particular frequency band. This imposes additional expense on the system operator and may not be able to ensure optimal performance of the system. The system operator must install at each subscriber's location the passive step attenuator or combination of passive step attenuators that most closely provides the level of attenuation it deems appropriate attenuation for that subscriber. Although the system operator can achieve greater resolution in attenuation as the producer makes more versions of the passive step attenuator, it may never be able to provide the precise attenuation deemed appropriate for each subscriber.

Finally, a passive step attenuator cannot adjust to time-varying conditions. Proper attenuation of signals in a CATV system requires that stronger RF signals be attenuated to a greater degree than weaker RF signals. RF signals may vary with time due to changing channel conditions. Ingress noise, for example, may temporarily increase because of the emergence of a sudden source of interference like a CB radio. Attenuation should increase to account for the increased noise. The properties of the passive step attenuator, however, are fixed upon manufacture.

BRIEF SUMMARY OF THE DISCLOSURE

Accordingly, in a first embodiment, there is disclosed an active step attenuator that automatically adjusts attenuation to achieve an appropriate power level. More specifically, in the first embodiment, the active step attenuator may be used to control the power level of signals in the return path of a bidirectional CATV system. In related embodiments, the active step attenuator is designed to control the power level of signals in the forward path or in both the forward and return paths.

In another embodiment, there is disclosed an active step attenuator that adjusts attenuation as a function of the power of an input signal. This adjustment is sufficient so that the same active step attenuator can be used for most subscriber units and so that it need not be used in combination with other active or passive step attenuators. Thus only one active step attenuator is needed to provide the proper attenuation. Furthermore, the attenuator is constructed of simple components possibly including resistors, inductors, capacitors, and diodes. The attenuator thus can be manufactured to small dimensions, such a cylinder an inch or less in diameter.

In a further embodiment, the disclosed device converts RF energy into a DC voltage that controls an active variable attenuator/gain circuit. This DC voltage changes as the RF energy of the input source changes. Thus attenuation is adjusted in real time with changes in RF signal strength.

In yet another embodiment, the disclosed device does not require an external source of power to operate. In this embodiment, the power of the input signal itself is used to control the attenuation.

A filter circuit in accordance with the above embodiments may include a diplex filter with two branches. The first branch comprises of a high-pass filter circuit through which signals above a predetermined frequency may pass with little or no attenuation. These higher-frequency signals are, in one embodiment, forward path CATV signals. The second branch includes a power circuit that rectifies the received RF signals below another predetermined frequency to convert them into a DC voltage. These lower frequency signals are, in one embodiment, reverse path CATV signals. The second branch further includes an active variable attenuator/gain circuit that attenuates the lower-frequency signals as a function of the DC voltage. This filter circuit can thus be used to attenuate reverse path CATV signals and to pass forward path CATV signals without attenuation.

Another filter circuit in accordance with the above embodiments may also include a diplex filter with two branches. In this filter circuit, the first branch comprises a low-pass filter circuit through which lower-frequency signals may pass with little or no attenuation. The second branch comprises a power circuit and active variable attenuator/gain circuit that attenuates higher-frequency signals. This circuit can thus be used to attenuate forward path CATV signals and to pass reverse path CATV signals without attenuation.

A different filter circuit in accordance with the above embodiments includes a diplex filter with two branches in which both branches provide active attenuation, one branch attenuating the forward path signals and the other branch attenuating the reverse path signals.

BRIEF DESCRIPTION OF DRAWINGS

Figure 1:
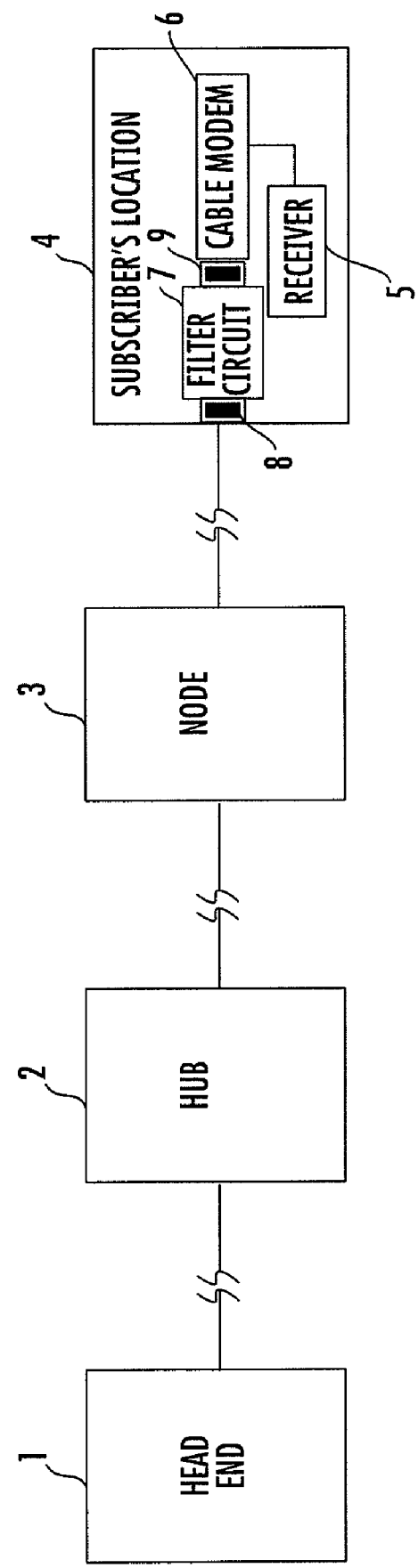

Having thus described the disclosure in general terms, reference will now be made to the accompanying drawings, wherein:

FIG. 1 is a block diagram of a system that includes one embodiment of the present invention.

Figure 2:
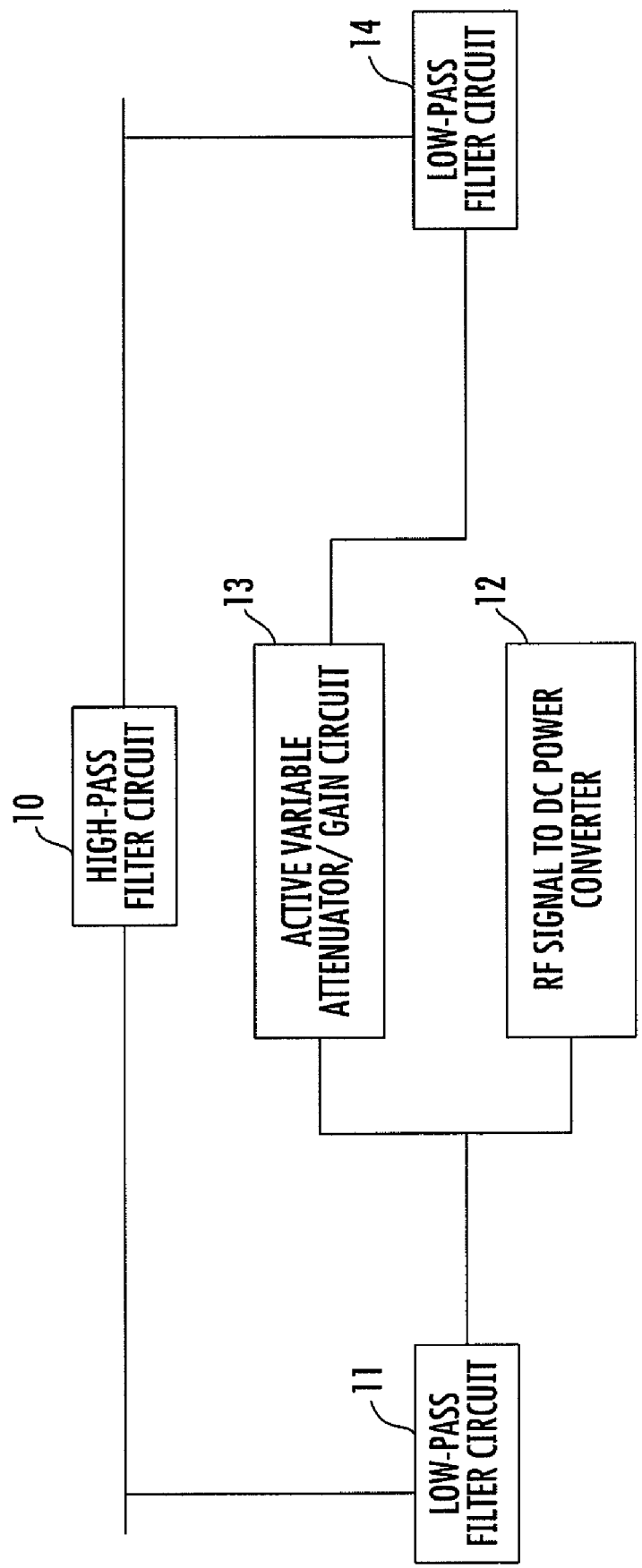

FIG. 2 is a block diagram of an embodiment of a circuit apparatus, in accordance with the present invention, that applies variable attenuation to signals below a first frequency.

Figure 3:
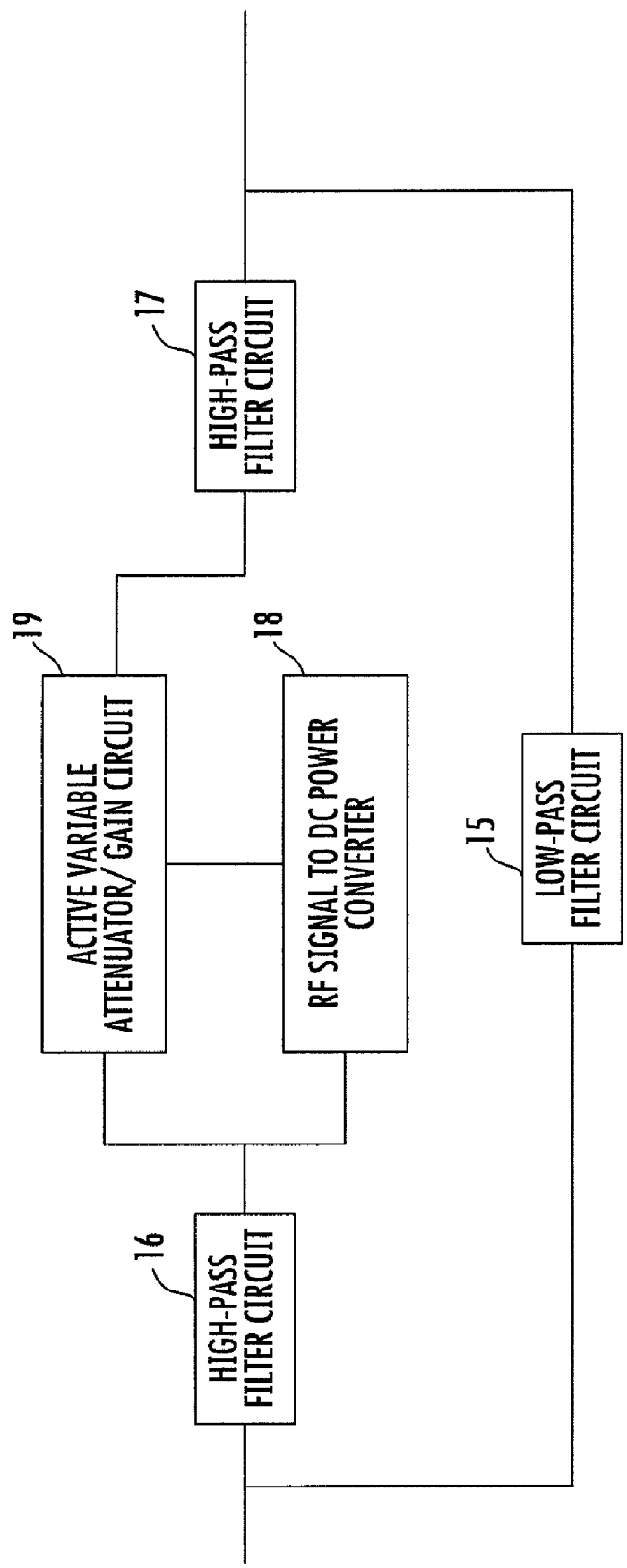

FIG. 3 is a block diagram of another embodiment of a circuit apparatus, in accordance with the present invention, that applies variable attenuation to signals above a first frequency.

Figure 4:
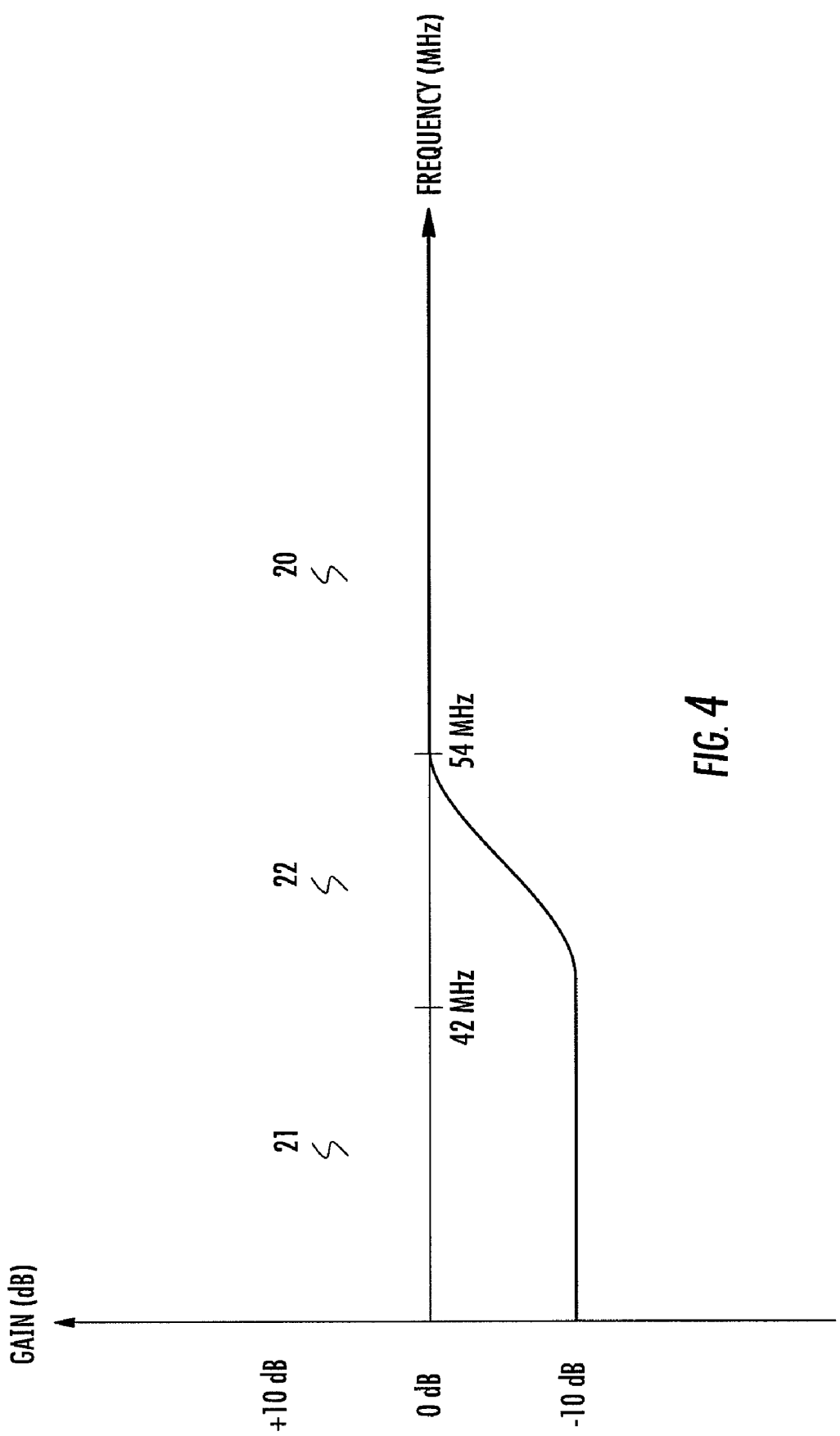

FIG. 4 is a frequency response of one embodiment of the present invention.

Figure 5:
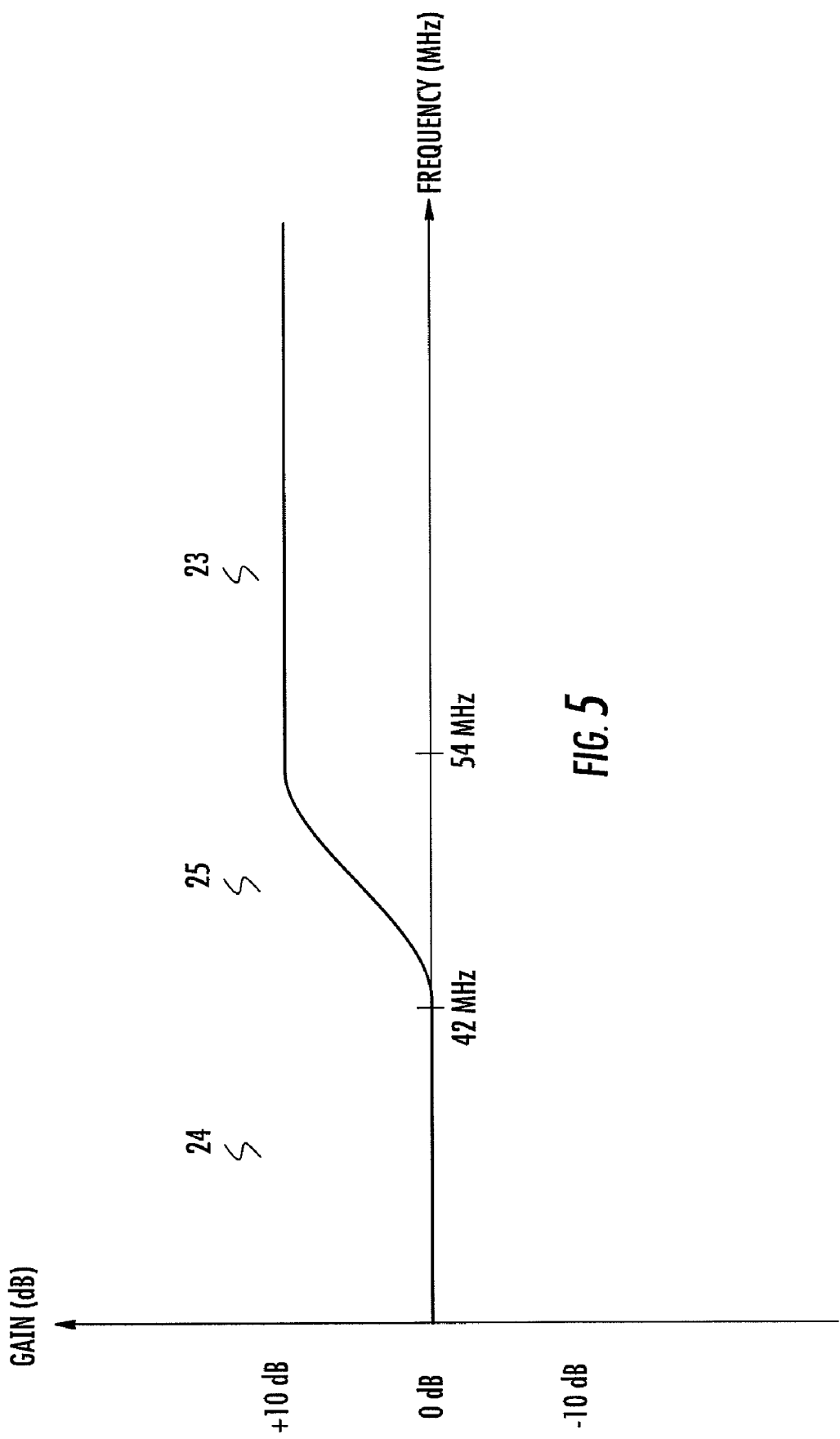

FIG. 5 is a frequency response of another embodiment of the present invention with preamplification of the RF signal.

Figure 6:
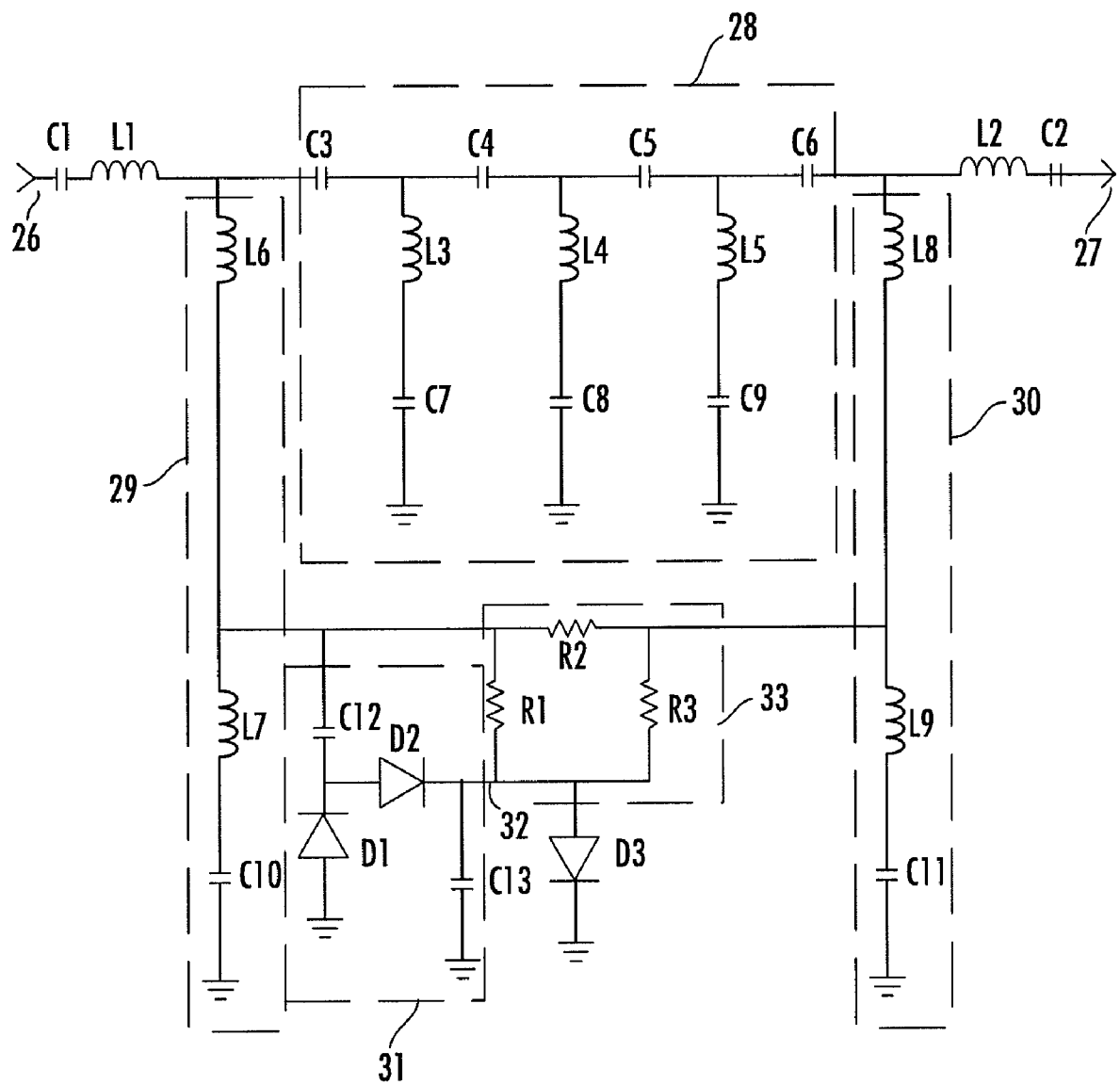

FIG. 6 is an electrical schematic of an embodiment of the present invention.

DETAILED DESCRIPTION OF THE DRAWINGS

The present invention now will be described more fully hereinafter with reference to the accompanying drawings, in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

It is noted that the frequencies provided herein are exemplary only and that the invention is no way limited to these exemplary frequencies. Via well known techniques of circuit design, including but not limited to adjustment of component values, it is possible to adjust any of the specified frequency ranges as necessary to meet design needs. Attenuation values are similarly exemplary.

It is also noted that one of skill in the art will understand references to a lack of attenuation to include finite but relatively low amounts of attenuation. At least because of resistive properties of all circuit components, including the connections themselves, and because of the nature of filter design, it may not be possible to achieve zero attenuation. For example, a high-pass portion or low-pass portion may be defined as non-attenuating if the loss is of magnitude 3 dB, i.e. fifty percent, or less.

With reference to the drawings, in FIG. 1 there is disclosed a block diagram of a hybrid fiber optic/coaxial CATV system in accordance with one embodiment of the present invention. The head end 1 is controlled by the CATV system operator. The head end receives broadcast television programming data representing broadcast channels from programming sources and distributes signals corresponding to the broadcast television programming data across a fiber optic cable system. The signals from the head end may pass through one or more hubs 2 before reaching node 3. From the node, the signals are transmitted via coaxial cable to taps at the subscribers' locations 4. A subscriber's location includes a receiver 5 equipped with an RF source 6 such as a cable modem or set top box. In accordance with the present invention, the subscriber's location further includes a filter circuit 7. The filter circuit 7 is an active step attenuator of the present invention. The filter circuit 7 has a first terminal 8 and a second terminal 9. For signals transmitted along the forward path, the first terminal serves as the input terminal and the second terminal serves as the output terminal. For signals transmitted along the reverse path, the second terminal serves as the input terminal and the first terminal serves as the output terminal. First terminal 8 is connected to the node 3 in communication with the head-end 1. Second terminal 9 is in communication with the RF source 6.

In one embodiment of the system shown in FIG. 1, signals in the forward path are transmitted in a frequency band that is higher than and does not overlap a second frequency band in which the reverse path signals are transmitted. For example, the signals from the node to the subscriber's location may be transmitted on the forward path at frequencies between 54 MHz and 1 GHz; signals from the subscriber's location to the node may be transmitted on the reverse path at frequencies between 5 MHz and 42 MHz. Note that these frequencies are exemplary only. The frequency bands will be system-dependent, and the present invention is fully compatible with any frequency usage. Note further that the present invention is not limited to use in a bidirectional cable system with a head end. The present invention is useful in other systems as well. For example, the present invention may be used to attenuate ingress noise in a system with outdoor antennas.

FIG. 2 depicts one embodiment of filter circuit 7 of FIG. 1 suitable for attenuating return path signals in a bidirectional CATV system. In this embodiment, the filter circuit is a diplex filter circuit consisting of two branches. The first branch comprises high-pass filter circuit 10. High-pass filter circuit 10 attenuates signals below a first frequency and passes signals above a second frequency without attenuation. In this embodiment, the high-pass filter circuit may be designed to attenuate reverse path signals and to pass forward path signals without attenuation. The second branch comprises low-pass filter circuit 11, RF signal to DC power converter 12, active variable attenuator/gain circuit 13, and a second low-pass filter circuit 14. The low-pass filter circuits 11 and 14 pass signals below a third frequency and fourth frequency, respectively, without attenuation, and attenuate signals above a fifth and sixth frequency, respectively. For example, the low-pass filter circuits may be designed to attenuate received forward path signals and to pass received reverse path signals without attenuation. RF signal to DC power converter 12 rectifies the low-pass-filtered alternating current RF signal to generate a resulting DC signal. The power of the resulting DC signal is a function of the power of the input RF signal. In an embodiment suitable for return path attenuation in the bidirectional CATV system discussed above, the input RF signal may be the output from the subscriber's cable modem and the resulting DC signal may be proportional to that RF signal. The active variable attenuator/gain circuit 13 receives the DC signal from RF signal to DC power converter 12 and also receives the low-pass-filtered alternating current RF signal from the low pass filter circuit 11. The active variable attenuator/gain circuit 13 applies attenuation to the RF signal in response to the current or voltage of the DC signal.

FIG. 3 depicts a second embodiment of filter circuit 7 of FIG. 1 suitable for attenuating forward path signals in a bidirectional CATV system. As in the embodiment of FIG. 2, the filter circuit of this embodiment is a diplex filter with two branches. In contrast to FIG. 2, however, the positions of the high- and low-pass filters are reversed. Specifically, one branch consists of a low-pass filter circuit 15 and the second branch consists of two high-pass filter circuits 16 and 17 along with the RF signal to DC power converter 18 and the active variable attenuator/gain circuit 19. In this embodiment, the first branch can be designed to attenuate forward path signals and to pass reverse path signals without attenuation. The second branch attenuates the reverse pass signals, rectifies the RF forward path signals to generate a DC signal, and uses the DC signal to adjust attenuation of the RF forward path signals.

Although each embodiment depicted herein is in the form of a diplex filter, this topology is not necessary to the present invention. The present invention may, for example, be constructed for use in a unidirectional communication system. In such a system, the present invention may omit consist of an RF signal to DC power converter and the active variable attenuator/gain circuit. Alternatively, the present invention may be constructed for use in a system with three or more RF sources, only one of which requires variable attenuation. In that case, a triplex or larger filter circuit may be appropriate.

Turning to FIG. 4, there is shown a frequency response of one embodiment of the present invention. Consistent with the possible use of this invention to attenuate signals in the return path of a CATV system having a forward path between 54 MHz and 1 GHz and a return path between 5 MHz and 42 MHz, the frequency response consists of two distinct portions separated by a transition portion. The portion 20 of the frequency response above 54 MHz has no attenuation. This portion 20 is the frequency response applied to the forward path signals that pass through the first branch of the embodiment of FIG. 2 with the high-pass filter circuit. The portion 21 of the frequency response below 42 MHz displays approximately flat attenuation of 10 dB. This portion 21 is the frequency response applied to the reverse path signals that pass through the second branch of the embodiment of FIG. 2. A third portion 22 represents a transition band between the high frequency portion of the frequency response and the low frequency portion of the frequency response. Preferably, the filter circuit of the present invention is designed so that this transition portion does not include data signals.

Note that, although the low frequency portion 21 depicted in FIG. 4 is shown to have flat 10 dB attenuation, this is not a necessary characteristic of the disclosed invention. The RF signal to DC power converter 12 and the active variable attenuator/gain circuit 13 can be designed to provide attenuation that is not flat in the low frequency portion 21 of the frequency response. Moreover, the magnitude of attenuation in low frequency portion 21 will vary with the strength of the RF input signal.

Turning to FIG. 5, there is shown a frequency response of another embodiment of the present invention suitable for attenuating the higher frequency forward path signals. In this embodiment, the filter circuit of FIG. 2 optionally includes preamplification of the RF signal. The high frequency portion 23 of the frequency response therefore initially shows a gain, here depicted to be 10 dB in the case of 10 dB preamplification. The low frequency portion 24 has no attenuation and the transition portion 25 exists between the low frequency portion 24 and the high frequency portion 23. In this embodiment, the current or voltage from the DC power converter 18 is input to the active variable attenuator/gain circuit 19 to reduce the amplified RF signals in portion 23.

With respect to FIG. 6, there is disclosed an electrical schematic of one embodiment of the present active step attenuator invention consistent with the diagram of FIG. 2, in which low frequency signals are adjustably attenuated. The active step attenuator uses the output RF signal from the subscriber's cable modem or other RF source to control and attenuate the low frequency signals while passing the high frequency signals from the node without attenuation. The circuit is diplex filter. Capacitor C1 and capacitor C2 are blocking capacitors. They are connected to first and second terminals 26 and 27, respectively. Blocking capacitors C1 and C2 clip low frequency signals and protect the other filter components against power surges in the cable. Matching inductors L1 and L2 are connected in series with blocking capacitors C1 and C2, respectively. These inductors match the impedance of the cable connected to first and second terminals 26 and 27 to the circuit.

With respect to the first branch of the diplex filter, capacitors C3, C4, C5, C6, C7, C8, and C9 and inductors L3, L4, and L5 form a high-pass filter 28 that passes signals above a first frequency. Although this filter is depicted as a Chebyshev, any suitable topology may be used, including Butterworth, Bessel, and max flat.

With respect to the second branch of the diplex filter, matching inductor L6 and inductor L7 and capacitor C10 form a low-pass filter 29. Matching inductor L8 and inductor L9 and capacitor C11 form a second low-pass filter 30. These low pass filters attenuate the high frequency signals in the second branch, which are passed without attenuation in the first branch, in order to isolate the higher frequency signals from the lower frequency signals.

The output from the first low-pass filter 29 is input to the RF signal to DC power converter, herein referred to as the power circuit 31. In FIG. 6, the power circuit rectifies and multiplies the voltage of the low-pass filtered RF signal. The power circuit of FIG. 6 is a rectifier and voltage multiplier circuit consisting of diodes D1 and D2 and capacitors C12 and C13. The design shown in FIG. 6 generates an output control signal 32 with double the voltage and half the current of the input low-pass filtered RF signal. This design is optional and could be replaced by any circuit that generates a DC signal with amplitude that is a function of the amplitude of the input low-pass filtered RF signal. For example, the power circuit could alternately be designed to quadruple the voltage with a correspondingly greater decrease of output current.

It should be noted that this embodiment of the power circuit is powered by the received RF signal. It generates control signal 32 without the use of an external power source other than the received RF signal itself.

The output from the first low-pass filter is also input to the active variable attenuator/gain circuit, herein referred to as attenuator 33. The attenuator of FIG. 6 is shown as a resistive network of three resistors R1, R2, and R3, arranged in the form of a "Π." Other resistive configurations suitable with the present invention include but are not limited to a three resistor "T" and a two resistor "L." Alternately, a reactive network could be constructed partially or wholly of lossy inductors.

The actual impedance experienced by the low-pass filtered RF signal is controlled by the output control signal 32 from the power circuit as it passes through control diode D3. The control diode functions as a switch. When no voltage is applied to the control diode D3, it appears as an open circuit and does not provide a path from the resistive network to ground. Thus, when no voltage is applied to the control diode D3, the resistive network does not cause any attenuation and the filter circuit remains passive. As the output control signal 32 increases in magnitude, the control diode passes an increasingly high current and acts more like a short to ground for attenuator 33. Thus as the received RF current increases, the impedance of the attenuator increases as well, applying greater attenuation to the low frequency return path signals.

The circuit depicted in FIG. 6 is unidirectional. It attenuates an RF signal received at terminal 26 and output at terminal 27. The circuit can be made bidirectional by adding a second power circuit between attenuator 33 and the second low-pass filter 30.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A filter circuit for adjusting attenuation of a first signal in response to the power of the first signal without use of an external power source other than the first signal itself, the filter circuit comprising:
a first terminal configured to receive the first signal;
a first element in electrical communication with said first terminal and configured to pass a portion of the first signal that is above a first frequency without attenuation and configured to cause attenuation to a portion of the first signal that is below the first frequency;
a second element in electrical communication with said first terminal and said first element and configured to rectify the first signal;
a third element in electrical communication with said second element and configured to cause attenuation to the first signal; and
a second terminal in electrical communication with said first element and said third element and configured to output the first signal;
wherein the magnitude of said attenuation in said third element is a function of the magnitude of the voltage of the first signal at an input to said third element.

2. The filter circuit of claim 1, wherein said first signal is an RF signal.

3. The filter circuit of claim 1, further comprising:
a fourth element in electrical communication with said first element and said second element and configured to pass a portion of the first signal that is below a second frequency without attenuation and configured to cause attenuation to a portion of the first signal that is above the second frequency; and
a fifth element in electrical communication with said first element and said third element and configured to pass a portion of the first signal that is below a third frequency without attenuation and configured to cause attenuation to a portion of the first signal that is above the third frequency.

4. The filter circuit of claim 3, further comprising:
a first blocking capacitor in electrical communication with said first terminal and with said fourth element; and
a second blocking capacitor in electrical communication with said fifth element and with said second terminal.

5. The filter circuit of claim 4, further comprising:
a first matching inductor in electrical communication with said first terminal and with said fourth element; and
a second matching inductor in electrical communication with said fifth element and with said second terminal.

6. The filter circuit of claim 1, wherein said third element comprises a reactive network in electrical communication with a diode in electrical communication with a ground.

7. The filter circuit of claim 1, wherein said third element comprises a resistive network in electrical communication with a diode in electrical communication with a ground.

8. The filter circuit of claim 7 arranged as a diplex circuit, wherein said first element is in a first branch of said diplex circuit and said second element and said third element are in a second branch of said diplex circuit.

9. The filter circuit of claim 7, wherein said second element is further configured to multiply the voltage of the first signal and to divide the current of the first signal.

10. The filter circuit of claim 9, wherein said second element is further configured to multiply the voltage of the first signal by a factor of two and to divide the current of the first signal by a factor of two.

11. The filter circuit of claim 9, wherein said second element comprises two capacitors and two diodes.

12. The filter circuit of claim 7, wherein said second terminal is further configured to receive a second signal and said first terminal is further configured to output the second signal.

13. The filter circuit of claim 12, further comprising a fourth element in electrical communication with said third element and with said second terminal and configured to rectify the second signal.

14. The filter circuit of claim 13 arranged as a diplex circuit, wherein said first element is in a first branch of said diplex circuit and said second element and said third element and said fourth element are in a second branch of said diplex circuit.

15. The filter circuit of claim 14, wherein said second element is further configured to multiply the voltage of the second signal and to divide the current of the second signal.

16. A filter circuit for adjusting attenuation of a first signal in response to the power of the first signal, the filter circuit comprising:
a first terminal configured to receive the first signal;
a first element in electrical communication with said first terminal and configured to pass a portion of the first signal that is below a first frequency without attenuation and configured to cause attenuation to a portion of the first signal that is above the first frequency;
a second element in electrical communication with said first terminal and said first element and configured to rectify the first signal;
a third element in electrical communication with said second element and configured to cause attenuation to the first signal; and
a second terminal in electrical communication with said first element and said third element and configured to output the first signal;

wherein the magnitude of said attenuation in said third element is a function of the magnitude of the voltage of the first signal at an input to said third element.

17. The filter circuit of claim 16, further comprising:
a fourth element in electrical communication with said first element and said second element and configured to pass a portion of the first signal that is above a second frequency without attenuation and configured to cause attenuation to a portion of the first signal that is below the second frequency; and
a fifth element in electrical communication with said first element and said third element and configured to pass a portion of the first signal that is above a third frequency without attenuation and configured to cause attenuation to a portion of the first signal that is below the third frequency.

18. The filter circuit of claim 17, wherein said third element comprises a reactive network in electrical communication with a diode in electrical communication with a ground.

19. The filter circuit of claim 18, further comprising an amplifier in electrical communication with said first terminal for amplifying said first signal.

20. A bidirectional communications system having a forward path to a subscriber and a return path from a subscriber, forward path signals being transmitted along the forward path and return path signals being transmitted along the return path, further comprising:
a diplex filter having a first branch comprising a high-pass filter circuit and a second branch comprising:
a first low-pass filter circuit;
a first rectifier and voltage multiplier circuit in electrical communication with said first low-pass filter circuit;
an attenuator circuit in electrical communication with said first rectifier and voltage multiplier circuit;
a control diode in electrical communication with said attenuator circuit; and
a second low-pass filter circuit in electrical communication with said attenuator circuit.

21. The system of claim 20, wherein:
said first low-pass filter circuit is connected in series to said first rectifier and voltage multiplier circuit;
said first rectifier and voltage multiplier circuit is connected in series to said attenuator circuit; and
said attenuator circuit is connected in series to said second low-pass filter circuit.

22. The system of claim 20, wherein said second branch further comprises a second rectifier and voltage multiplier circuit in electrical communication with said attenuator circuit and with said second low-pass filter circuit.

23. The system of claim 22, wherein:
said attenuator circuit is connected in series to said second rectifier and voltage multiplier circuit; and
said second rectifier and voltage multiplier circuit is connected in series to said second low-pass filter circuit.

24. A method of adjusting attenuation in response to the power of an RF signal without use of an external power source other than the RF signal itself, the method comprising:
receiving an RF signal that includes a first portion in a first frequency band spectrum and a second portion in a second frequency band above said first frequency band;
high-pass filtering said RF signal to cause attenuation to the first portion in the first band and to pass the second portion in the second band without attenuation;
low-pass filtering said RF signal to pass the first portion in the first band without attenuation and to cause attenuation to the second portion in the second band;
rectifying and multiplying the voltage of the first portion;
causing variable attenuation to the first portion;
low-pass filtering said RF signal to pass the first portion in the first band without attenuation and to cause attenuation to the second portion in the second band; and
outputting said first portion and said second portion;
wherein the magnitude of said variable attenuation is a function of the magnitude of the first portion after the step of rectifying and multiplying the voltage of the first portion.

25. The method of claim 24, wherein said step of causing variable attenuation comprises passing the first portion through a control diode to ground so and wherein the magnitude of said variable attenuation is a function of the magnitude of the current of the first portion passing through the control diode.

* * * * *